United States Patent [19]

Sakano et al.

[11] Patent Number: 4,803,692
[45] Date of Patent: Feb. 7, 1989

[54] SEMICONDUCTOR LASER DEVICES

[75] Inventors: Shinji Sakano, Kokubunji; Hiroyoshi Matsumura, Saitama, both of Japan

[73] Assignee: Hitachi, Ltd., Tokyo, Japan

[21] Appl. No.: 903,376

[22] Filed: Sep. 3, 1986

[30] Foreign Application Priority Data

Sep. 4, 1985 [JP] Japan .................................. 60-193742

[51] Int. Cl.$^4$ ............................................... H01S 3/19
[52] U.S. Cl. ........................................ 372/50; 372/20; 372/29; 372/45; 372/96
[58] Field of Search ....................... 372/44, 45, 46, 96, 372/50, 29, 32, 20

[56] References Cited

U.S. PATENT DOCUMENTS 4,485,474  11/1984  Osterwalder ......................... 372/28
4,631,730  12/1986  Miller .................................. 372/50

FOREIGN PATENT DOCUMENTS 0006372  9/1980  European Pat. Off.
0117734  9/1984  European Pat. Off.

OTHER PUBLICATIONS

The Preliminary Reports for the National Meeting of the Institute of Electronics and Communication Engineers of Japan 4, 1985, p. 22.
IEEE J. Quantum Electron, vol. QE-16, (1980) p. 347.
Patent Abatracts of Japan, vol. 9, No. 251 (E-348) [1974], 8th Oct. 1985; & JP-A-60 100 491 (Nippon Denshin Denwa Kosha) 04-06-1985.
I.E.E.E. Spectrum, vol. 20, No. 12, pp. 38-45, Dec. 1983, IEEE, New York, US; T. E. Bell: "Single-Frequency Semiconductor Lasers".
Laser Focus, vol. 13, No. 8, Aug. 1977, pp. 72-75, Newton, Mass., US; D. Anafi et al.: "Shifting or Stabilizing Laser Frequency with E-O Modulator in or Outside Cavity".

Primary Examiner—William L. Sikes
Assistant Examiner—Georgia Y. Epps
Attorney, Agent, or Firm—Antonelli, Terry & Wands

[57] ABSTRACT

It is possible to narrow the emission spectrum linewidth of a semiconductor laser device by coupling optically an external resonator with one end surface of the semiconductor laser. However, the structure of the external resonator should match the phase of the light emitted by the laser. Heretofore, this matching has been effected by adjusting the length of the external resonator, and hence productivity and reproducibility have not been good. According to this invention, characteristics of the external resonator can be adjusted electrically to be matched with the phase of the emitted light owing to the fact that the external resonator is made of a material, whose refractive index can be varied electrically. Therefore the semiconductor laser device according to this invention is very practical.

24 Claims, 2 Drawing Sheets

SEMICONDUCTOR LASER DEVICES

BACKGROUND OF THE INVENTION

This invention relates to semiconductor laser devices and in particular to the stabilization in narrowing the spectrum linewidth, suitable for the light emitting source in coherent optical transmission systems.

Heretofore the narrowing of the emission spectrum linewidth of semiconductor laser devices with a external cavity is effected by utilizing coupling between the modes of the cavity within the laser and the external cavity. However, the condition to get this effect is very critical and it is known that widening of spectrum linewidth, wavelength jumping or output power fluctuations are caused by slight variations in injection current and temperature. An example therefor may be the one reported in an article in the preliminary reports for the national meeting of the Institute of Electronics and Communication Engineers of Japan 4, 1985, p. 22. Further, it is conceivable to control the length of the external cavity in submicron order by jointing a piezo element with the reflecting surface of the external cavity and by utilizing electro-striction as a method for varying the length of the external cavity in order to control the phase of feedback light to the internal cavity. This method is described e.g. in IEEE J. Quantum Electron. Vol. QE-16, p. 347, (1980). However, since, according to this method, optical axis alignment, mounting process, etc. need very precise techniques, this method is not practical.

SUMMARY OF THE INVENTION

An object of this invention is to provide a semiconductor laser device, which has a narrow spectrum linewidth at an arbitrary oscillation wavelength and few fluctuations in wavelength and in linewidth.

The inventors of this invention have paid attention to the fact that the phase matching at the junction between the two cavities must be controlled with a high precision for narrowing the spectrum linewidth of the semiconductor laser using an external cavity, because the phase matching between the lights the internal and external cavities of the laser is utilized therefor. In fact, when injection current is varied in a semiconductor laser having a fixed external cavity, phase matching is achieved at an appropriate injection current and light is emitted with a very narrow spectrum linewidth. It is thought that this is due to the fact that the refractive index varies with variations of the carrier density within the cavity and the phase of the light varies at the junction interface so that the phase matching condition is satisfied. However, when the optical path length in the external cavity is constant, the phase matching condition for narrowing spectrum linewidth varies with variations in refractive index due to variations in laser injection current and temperature. Thus, the spectrum linewidth and the oscillation wavelength can change easily. Therefore, the inventors of this invention have changed their point of view and intended to control electrically the phase and the intensity in the external cavity. Thus it has been studied to obtain light emission having a stable and narrow spectrum linewidth by controlling electrically the optical path length in the external cavity so that the phase in the external cavity is always matched with that in the internal cavity. In order to control the optical path length in the external cavity, a material the refractive index of which can be changed electrically is used for forming the cavity. Further, it has been also studied to effect the light intensity adjustment within the external cavity of the same material. In addition, attention has been paid to the fact that, if this external cavity can be constructed to be monolithic, its temperature controllability and the coupling efficiency between the internal and external cavities are ameliorated and a method for monolithic integration has been studied. In this way this invention has been done for realizing an integrated semiconductor laser, by which control of feedback light intensity (light intensity within the external cavity) and phase is possible by utilizing the principle of the carrier injection type optical switch.

According to this invention, it is possible to control easily the oscillation spectrum linewidth of the semiconductor laser so as to obtain the narrowest state by controlling the optical path length in the external cavity. Furthermore, it is possible to obtain easily a narrow spectrum linewidth having a stable oscillation wavelength by controlling feedback light intensity (light intensity within the external cavity). As stated above, an effect can be obtained to provide a semiconductor laser suitable for the light emitting source in coherent optical transmission systems.

BRIEF DESCRIPTION OF THE DRAWINGS

FIG. 2b is a perspective view of the device indicated in FIG. 2a;

FIG. 4b is a cross-sectional view along the line A—A' of the element indicated in FIG. 4a.

DESCRIPTION OF THE PREFERRED EMBODIMENTS Embodiment 1

Figure 1:
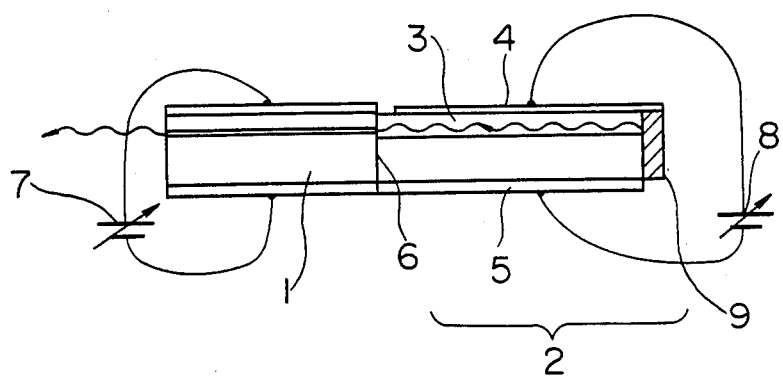
FIG. 1 is a cross-sectional view illustrating a semiconductor laser and an external cavity made of $LiNbO_3$ and jointed therewith.

FIG. 1 illustrates a well-known semiconductor laser 1 and an optical waveguide path 3 for the external cavity made of a crystal of $LiNbO_3$, which is an electro-optic material and in contact with a facet at one side thereof. The semiconductor laser 1 and $LiNbO_3$ 2 for the external cavity are so aligned and fixed that light reflected by a reflective end 9 of the $LiNbO_3$ returns to the semiconductor laser 1. This external cavity is 7 mm long and 6 $\mu$m wide. The incidence end 6 of the external cavity is in contact with the semiconductor laser. A reflective facet 9 is disposed at the end surface opposite to the incidence end of the external cavity. The $LiNbO_3$ is Z-cut and the optical waveguide path 3 is formed by Ti diffusion. Electrodes 4 and 5 are so formed that electric field is applied along the y-axis of the crystal. The semiconductor laser 1 is made of InGaAsP/InP and its oscillation wavelength is 1.54 $\mu$m. It is possible to control narrowing of the spectrum linewidth with respect to an arbitrary laser output and wavelength by varying the voltage applied to the external cavity 2 within a range of 0 to 3 V so as to control the optical path length of the external cavity. Further the similar result can be obtained, even if $LiNbO_3$ is replaced by $LiTaO_3$.

EMBODIMENT 2

Figure 2A:
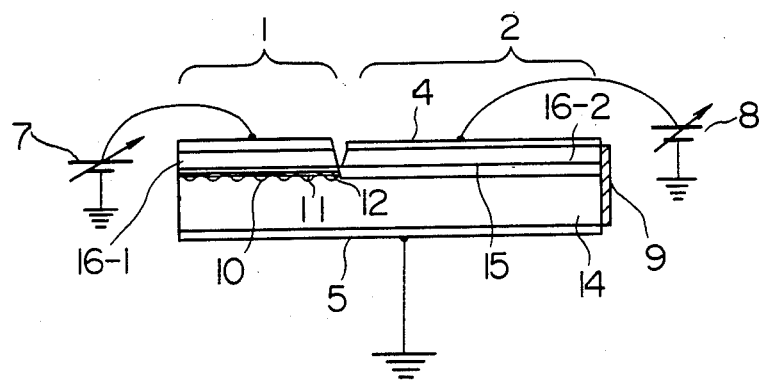
FIG. 2a is a cross-sectional view illustrating a semiconductor laser and a phase controllable external cavity constructed in a monolithic form.

Explanation will be made while referring to FIGS. 2a and 2b. A diffraction grating having a period of 234 nm is cut on the surface of an n-conductivity type InP substrate 14. A guiding layer 10 (InGaAsP having a band gap wavelength λg=1.3 μm) for the distributed feedback type laser, an active layer 11 (λg=1.53 μm), an antimeltback layer 12 (λg=1.3 μm) and a p-conductivity type InP layer 16-1 are superposed on each other by liquid phase growth. Then, after having removed the grown layers located on the external cavity 2 by selective etching, an optical waveguide layer 15 (λg=1.3 μm) and a p-conductivity type InP layer 16-2 are superposed on each other by liquid phase growth. A part of the grown layers is removed so that a mesa stripe about 1 μm wide, which stretches over both the two regions (1 and 2), is formed. After that, p-, n-, and p-conductivity type InP layers are grown one after another as a clad layer for blocking a current and for forming a waveguide by distributed refractive index. In order to isolate electrically the laser and the external cavity, unnecessary portions of the grown layers are removed by etching, remaining the optical waveguide path. An SiO2 layer is formed thereon, in which a window is formed at the region for current injection, where an anode electrode 4 is formed by evaporation. After having formed a cathode electrode 5 by evaporation on the back (rear) side surface, an SiO2 layer for isolation is superposed on the end surface of the external cavity and an Au film for reflection mirror is formed thereon by evaporation. In the case where the external cavity is 2 mm long, when an electric current of 20 mA flows through the external cavity (the refractive index being controlled by such injection level), it is confirmed that the mode in the external cavity is changed by 1. Furthermore, even in the case where oscillation wavelength of the laser varies in a range of 1.5455–1.5465 μm due to variations in injection current, the condition for continuously narrowing the spectrum linewidth can be realized, through the observation in varying the current level flowing through the external cavity in the range of 0 to about 100 mA.

Figure 2B:
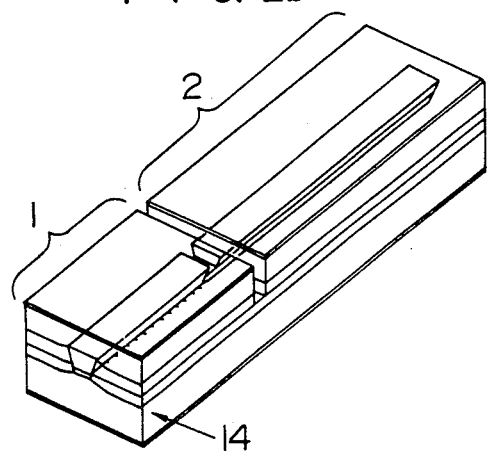

FIG. 2b is a perspective view of the element of this embodiment.

As explained above, by forming the monolithic form it is easy to control the spectrum linewidth narrowing.

EMBODIMENT 3

Figure 3:
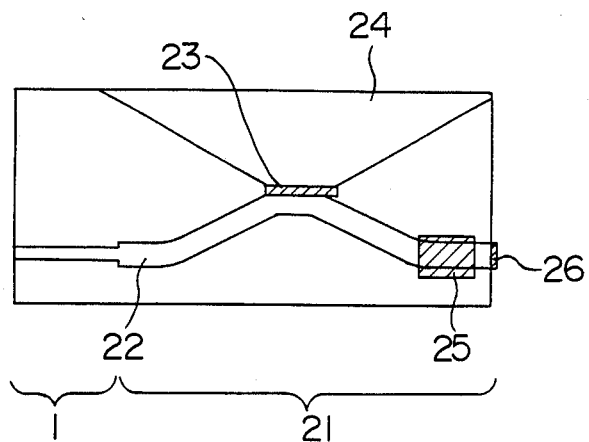
FIG. 3 is a top view illustrating an element, in which a semiconductor laser and a feedback light intensity and phase controllable external cavity are constructed in a monolithic form.

Explanation will be made while referring to FIG. 3. FIG. 3 is a top view of an element, in which an optical waveguide path 22, a reflective and transparent area 23 for adjusting the feedback light intensity (i.e. the ratio of reflected light intensity to refracted or transmitted light intensity being adjustable), a phase controlling area (i.e. an external cavity) 25, an extra power reduction area 24 for reducing the feedback light intensity upon adjustment thereof and a reflective coating 26, all of which, except the coating 26, are made of III-V compound crystals. The intensity and the phase of the light within the external cavity can be controlled by varying the refractive index by allowing an electric current to flow through the reflective area 23 for adjusting the feedback light intensity and either by applying a voltage to the phase controlling area 25 or by making an electric current to flow therethrough. Owing to this construction, it is possible to suppress the mode fluctuation within the internal cavity at an arbitrary laser output and wavelength and to obtain a stable and narrow spectrum linewidth at a constant wavelength. Absorption of light by semiconductor and absorption of light by free carriers can be also utilized for this control of feedback power within the external cavity.

EMBODIMENT 4

Another embodiment of this invention will be explained, referring to FIGS. 4a and 4b.

Figure 4A:
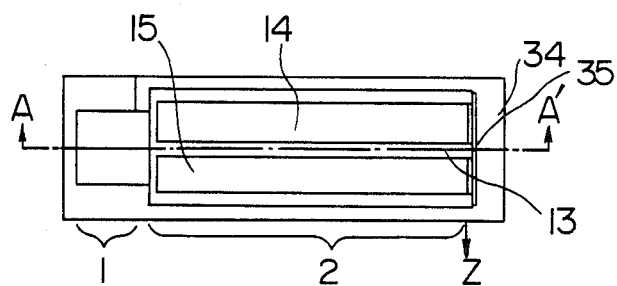
FIG. 4a is a top view of an element used in Embodiment 4.
Figure 4B:
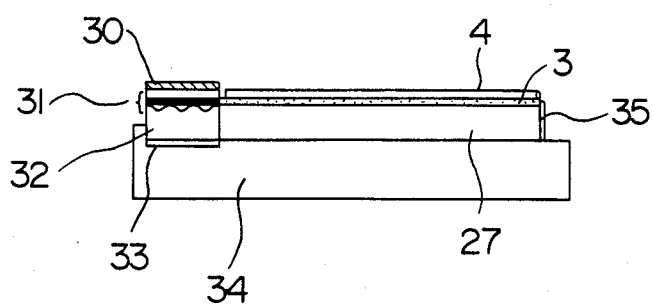

An external resonator is constructed by forming electrodes 14, 15 for applying a voltage at both the sides of an optical waveguide path 13, which is formed by diffusing Ti in an LiNbO3 substrate 27, Z-cut as indicated in FIG. 4a, beside a DFB (distributed feedback type) laser 1 having an oscillation wavelength 1.55 μm, comprising positive and negative electrodes 30 and 33, respectively, and buried multiple layers 31 including an active layer formed on an InP substrate 32. This laser 1 and the external resonator are so regulated that the optical waveguide path receives the laser output and is secured on a fixed base 34. This external resonator is 7 mm long and 6 μm wide and reflective coating of Au 35 is disposed on its end surface. Electric current for driving the DFB laser is set at an intensity two times as high as its threshold intensity. Variations in output intensity and spectrum linewidth accompanied by variations in phase of the returning light are confirmed by varying the voltage between the two electrodes of the external resonator in a range of 0–3 V.

The similar results can be obtained also, when a semiconductor of GaAs family and Si family, is used instead of those of InP family in the above described embodiments.

What is claimed is:
1. A semiconductor laser device comprising:
 a semiconductor laser including a semiconductor active layer formed on a semiconductor substrate and having a pair of light emitting and reflecting end surfaces, thereby defining an internal cavity, and a pair of electrodes operably connected to said semiconductor active layer for allowing a current to flow through the semiconductor active layer;
 a resonator having end surfaces which define an external cavity with an optic axis aligned with said semiconductor laser, the resonator being optically coupled to the semiconductor laser, the external cavity of the resonator being in contact with the internal cavity of the semiconductor laser so as to form a junction between said external cavity and said internal cavity, the resonator being made of a material which can electrically change an optical path of said external cavity; and
 means coupled to said resonator for electrically controlling the optical path of said external cavity.

2. A semiconductor laser device according to claim 1, in which said semiconductor laser and said resonator are formed in a monolithic form on a compound semiconductor crystal substrate.

3. A semiconductor laser device according to claim 2, in which said resonator includes an area for regulating electrically the intensity of light passing therethrough.

4. A semiconductor laser device according to claim 1, wherein said material is a material which can have its refractive index electrically changed so as to electrically change said optical path of said external cavity.

5. A semiconductor laser device according to claim 4, wherein said laser and said resonator are aligned end to end.

6. A semiconductor laser device according to claim 5, wherein said laser and said resonator are mainly formed of a same III-V compound material.

7. A semiconductor laser device according to claim 6, wherein said resonator includes a reflection mirror at the opposite end to that coupled to said laser.

8. A semiconductor laser device according to claim 1, comprising means coupled to said resonator for controlling light intensity within the external cavity.

9. A semiconductor laser device according to claim 8, wherein said means coupled to said resonator for controlling light intensity within the external cavity includes a reflective and transparent area for adjusting feedback light intensity.

10. A semiconductor laser device according to claim 9, wherein the device includes an optical waveguide path, and wherein said reflective and transparent area is adjacent said optical waveguide path.

11. A semiconductor laser device according to claim 9, wherein said means coupled to said resonator for electrically controlling the optical path of said external cavity includes a phase controlling area, the phase controlling area being spaced from said reflective and transparent area.

12. A semiconductor laser device according to claim 1, wherein said external cavity is made of a crystal of material selected from the group consisting of $LiNbO_3$ and $LiTaO_3$.

13. A semiconductor laser device according to claim 1, wherein said semiconductor laser is a distributed feedback laser.

14. A semiconductor laser device according to claim 13, wherein said distributor feedback laser includes a guiding layer adjacent said active layer.

15. A semiconductor laser device according to claim 14, wherein said semiconductor substrate is made of InP, and said guiding layer is made of InGaAsP.

16. A semiconductor laser device according to claim 1, wherein said semiconductor laser includes a guiding layer adjacent said active layer.

17. A semiconductor laser device according to claim 1, wherein said resonator includes an optical waveguide path, and said means coupled to said resonator for electrically controlling the optical path of said external cavity includes two electrodes for applying a voltage at both sides of the optical waveguide path.

18. A semiconductor laser device according to claim 1, wherein said means coupled to said resonator for electrically controlling the optical path of said external cavity is a means for controlling the optical path of the external cavity so that the phase of the light in the external cavity is matched to the phase of the light in the internal cavity.

19. A semiconductor laser device according to claim 1, wherein the means for electrically controlling the optical path of the external cavity is a means for electrically controlling the optical path length in the external cavity.

20. A semiconductor laser device comprising:
a semiconductor substrate;
a semiconductor laser element formed on said semiconductor substrate, said semiconductor laser element including an active layer for emitting light and semiconductor layers sandwiching the active layer, wherein the active layer and the semiconductor layers constitute an internal cavity;
a resonator element formed on said semiconductor substrate, said resonator element having an optical waveguide which constitutes an external cavity, the external cavity being optically coupled with the internal cavity, the external cavity being in contact with the internal cavity so as to form a junction between the external cavity and the internal cavity, the optical waveguide including a region for changing the refractive index thereof;
a first electrode formed on said semiconductor laser element; and
at least one second electrode formed on said resonator element, supplying carriers to the region for changing the refractive index of the optical waveguide.

21. A semiconductor laser device according to claim 20, wherein the internal cavity and the external cavity are separate cavities.

22. A semiconductor laser device according to claim 20, comprising means, connected to said at least one second electrode, for controlling the optical waveguide such that the phase of the light in the external cavity is matched to the phase of the light in the internal cavity.

23. A semiconductor laser device according to claim 23, wherein said semiconductor laser element is a distributed feedback laser.

24. A semiconductor laser device comprising:
a semiconductor substrate;
a semiconductor laser element formed on said semiconductor substrate, the semiconductor laser element including an active layer for emitting light and semiconductor layers sandwiching the active layer, the active layer and semiconductor layers forming a first resonant cavity, the first resonant cavity having a pair of light emitting end surfaces, and electrode means operably connected to said semiconductor active layer for allowing a current to flow through the active layer;
a second resonant cavity optically coupled with the semiconductor laser element at one of the light emitting end surfaces, the second resonant cavity being in contact with the first resonant cavity so as to provide a junction between the first resonant cavity and the second resonant cavity, wherein the second resonant cavity is made of a material, the refractive index of which is electrically changeable, so as to change an optical path length in the second resonant cavity.

* * * * *